(12) United States Patent
Hamberger

(10) Patent No.: US 10,090,098 B2
(45) Date of Patent: Oct. 2, 2018

(54) ARRANGEMENT AND METHOD FOR REDUCING A MAGNETIC UNIDIRECTIONAL FLUX COMPONENT IN THE CORE OF A TRANSFORMER

(71) Applicant: Siemens Aktiengesellschaft, Munich (DE)

(72) Inventor: Peter Hamberger, Kirchschlag bei Linz (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/523,785

(22) PCT Filed: Sep. 29, 2015

(86) PCT No.: PCT/EP2015/072385
§ 371 (c)(1),
(2) Date: May 2, 2017

(87) PCT Pub. No.: WO2016/074846
PCT Pub. Date: May 19, 2016

(65) Prior Publication Data
US 2017/0330682 A1    Nov. 16, 2017

(30) Foreign Application Priority Data
Nov. 11, 2014   (EP) .................................... 14192611

(51) Int. Cl.
*H01F 27/34* (2006.01)
*H01F 27/42* (2006.01)
(Continued)

(52) U.S. Cl.
CPC ............. *H01F 27/34* (2013.01); *H01F 27/42* (2013.01); *H01F 29/14* (2013.01); *H03H 7/09* (2013.01)

(58) Field of Classification Search
CPC .......... H01F 27/34; H01F 29/14; H01F 27/42; H03H 7/09
See application file for complete search history.

(56) References Cited

U.S. PATENT DOCUMENTS

| 8,314,674 B2 * | 11/2012 | Hamberger | ............. | H01F 27/34 |
| | | | | 323/356 |
| 9,183,980 B2 * | 11/2015 | Hamberger | ............. | H01F 29/14 |
| 2017/0213641 A1 * | 7/2017 | Hamberger | ............ | G01R 33/02 |

FOREIGN PATENT DOCUMENTS

| CN | 101681716 | 3/2010 |
| CN | 103270561 | 8/2013 |

(Continued)

*Primary Examiner* — Kyle J Moody
(74) *Attorney, Agent, or Firm* — Cozen O'Connor

(57) ABSTRACT

An arrangement for reducing a magnetic unidirectional flux component in the core of a transformer includes a measurement apparatus which provides a measurement signal corresponding to the magnetic unidirectional flux component, a compensation winding magnetically coupled to the core of the transformer, wherein magnetic flux flowing in the core induces a voltage in the compensation winding, a switch device arranged electrically in series together with the compensation winding in a current path, a control device which controls the switch device via a control parameter, where the switch unit comprises a magnetic core and a winding arrangement which is magnetically coupled to the magnetic core, and the control parameter is supplied to the winding arrangement such that the magnetic saturation state of the core is variable, whereby the conductive state of the switch unit can be produced.

14 Claims, 5 Drawing Sheets

(51) Int. Cl.
*H01F 29/14* (2006.01)
*H03H 7/09* (2006.01)

(56) References Cited

FOREIGN PATENT DOCUMENTS

| | | |
|---|---|---|
| CN | 103270562 | 8/2013 |
| DE | 32 37 584 A1 | 4/1984 |
| WO | WO 2008/151661 A1 | 12/2008 |
| WO | WO 2012/041367 A1 | 4/2012 |
| WO | WO 2012/041368 A2 | 4/2012 |

* cited by examiner

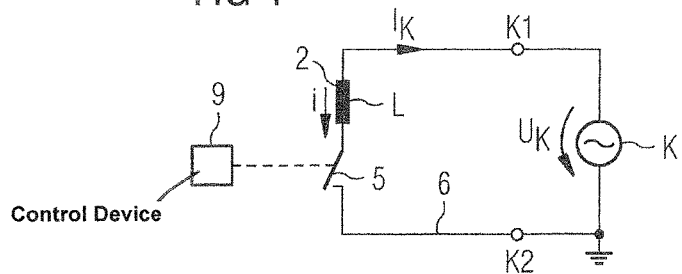
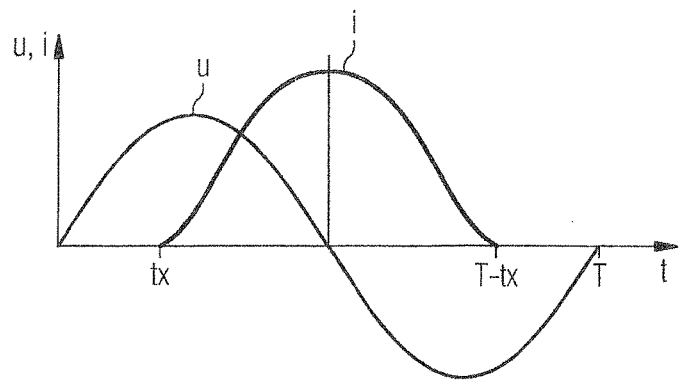
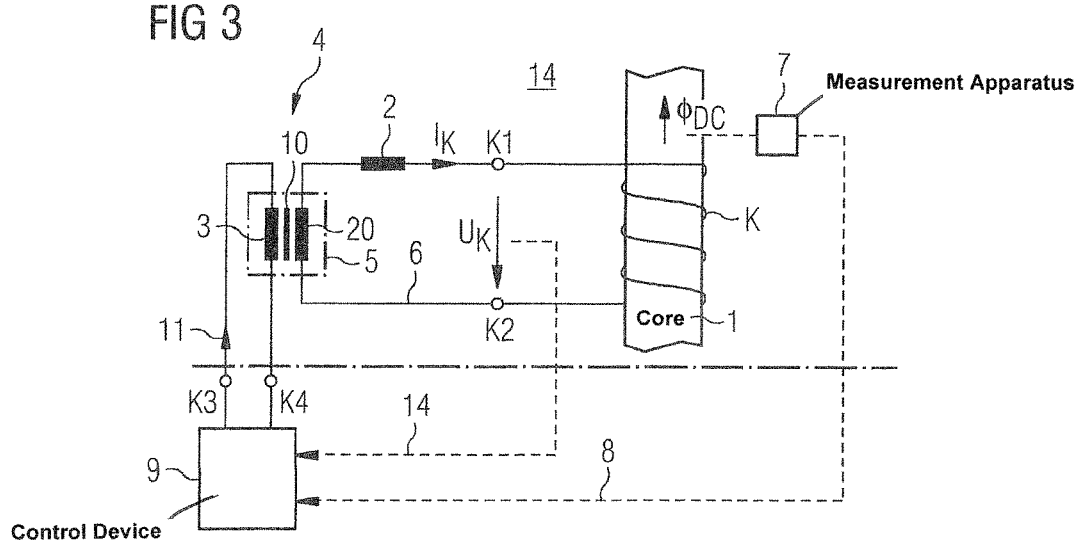

ARRANGEMENT AND METHOD FOR REDUCING A MAGNETIC UNIDIRECTIONAL FLUX COMPONENT IN THE CORE OF A TRANSFORMER

CROSS REFERENCE TO RELATED APPLICATIONS

This is a U.S. national stage of application No. PCT/EP2015/072385, filed on 29 Sep. 2015. Priority is claimed on European Application No. EP14192611.3, filed 11 Nov. 2014, the content of which is incorporated herein by reference in its entirety.

BACKGROUND OF THE INVENTION

1. Field of the Invention

The invention relates generally to electrical transformers such as those used in energy transmission and distribution networks and, more particularly, to an arrangement and a method for reducing a magnetic unidirectional flux component in the core of a transformer, comprising a measurement apparatus which provides a measurement signal corresponding to a magnetic unidirectional flux component flowing in the core of the transformer, a compensation winding magnetically coupled to the core of the transformer, and a switch unit arranged electrically in series with the compensation winding in a current path to inject a current into the compensation winding, the effect of which current is directed against the unidirectional flux component, where the switch unit is controllable via a control parameter that is provided by a control device. The present invention further relates to a method for converting a transformer.

2. Description of the Related Art

In electrical transformers such as those used in energy transmission and distribution networks, an unwanted injection of direct current into the primary winding and/or secondary winding can occur. Such an injection of direct current, also referred to as a DC component in the following, can be caused by power-electronic structural components, such as those used today for the activation of electrical drives or for reactive power compensation. A further source can be "Geomagnetically Induced Current" ((GIC). DC injection and GIC can also occur simultaneously in a transformer.

A DC component or a GIC results in a magnetic unidirectional flux component in the core of the transformer, where the unidirectional flux component is superimposed on the alternating flux. This gives rise to unbalanced modulation of the magnetic material in the core, and a range of associated disadvantages. Even a direct current of only a few amperes results in a significant increase in losses (e.g., 20-30%). Heating problems occur in the case of high GIC in particular. Local heating in the transformer can adversely affect the service life of the winding insulation. Increased noise emissions also occur during operation, and are considered particularly disruptive if the transformer is installed in the vicinity of a residential area.

Various devices that operate actively or passively for the purpose of DC compensation and/or reducing operating noises of a transformer are known. According to WO 2012/041368 A1, for example, use is made of the electrical voltage that is induced in the compensation winding, where the voltage is utilized to compensate the disruptive magnetic unidirectional flux component. This is effected by an electronic switch unit which, by clocking semiconductor elements, generates a pulsating compensation current that is injected into the compensation winding. In this case, activation time is triggered by the phase of the voltage that is induced in the compensation winding. The activation duration is governed by a sensor signal, which captures the unidirectional flux component to be compensated and provides it as a measurement signal. A separate energy source is not required here. A switch element can take the form of a thyristor, for example, which is fired and then blocks again automatically at current zero. The level of the compensation current can be adjusted via the phase angle.

The service life of a semiconductor element is, however, quite dependent on the temperature. Cooling devices are required to protect against overloading. The maximum possible heating limits the maximum current that can be routed via the thyristor. The electrical voltage induced in the compensation winding represents a further problem, and currently limits any use of DC compensation to 690 V in practice. In the case of very large transformers, such as those used for high-voltage direct-current transmission (HVDCT), the voltage per turn can however be far greater than 690 V at the compensation winding. The use of thyristors for 5 kV, 8 kV and even more is feasible today, but the costs are high. Existing solution frameworks developed for unidirectional flux compensation therefore only cover the field of low-voltage specifications. Therefore, the existing possibilities of semiconductor technology allow only limited use of the unidirectional flux compensation. The reliability is also unsatisfactory in the case of DC compensation systems. In comparison with the service life of a power transformer, which is designed to function reliably over a number of decades, the expected service life of a semiconductor switch device including a cooling device is much shorter. However, and particularly in the field of power transformers, there is significant demand for unidirectional flux compensation which is suitable for use in practice, will function reliably over an extended operating period, is technically simple in design, and can be manufactured economically.

SUMMARY OF THE INVENTION

It is an object of the present invention to provide an arrangement and a method for reducing a unidirectional flux component of a magnetic flux in a core of a transformer, where maximum reliability can be achieved in practice for transformers in an energy transmission and distribution network, and realization is as simple as possible. A further object of the invention is to provide a method for converting or upgrading a transformer with unidirectional flux compensation.

These and other objects and advantages are achieved in accordance with the invention by a device, a method, and a method for the conversion by which in order to generate the compensation current, the previously used conventional power electronics are replaced by structural components that are based exclusively on a magnetic operating principle.

The invention takes as its starting point an arrangement for reducing a magnetic unidirectional flux component ($\Phi_{DC}$) in the core of a transformer, where the arrangement comprises:

(i) a measurement apparatus, which provides a measurement signal corresponding to the magnetic unidirectional flux component ($\Phi_{DC}$), (ii) a compensation winding magnetically coupled to the core of the transformer, where the magnetic flux flowing in the core induces a voltage ($U_K$) in the compensation winding, (iii) a switch device arranged electrically in series with the compensation winding in a current path, and (iv) a control device, which controls the switch device via a control parameter such that the switch device can be switched to a conductive state at an activation time, where the activation time is dependent on the measurement signal and is network-synchronous, i.e., phase-synchronous to the voltage in the compensation winding (K), whereby a current is injected into the compensation winding (K), the effect of which is directed against the unidirectional flux component ($\Phi_{DC}$).

Unlike the switch devices previously embodied in semiconductor technology, the inventive switch device consists of a magnetic core and a winding arrangement which is magnetically coupled to said core, where the winding arrangement can consist solely of a control winding and a load winding. A control current is injected into the control winding, such that the magnetic saturation state of the core can be varied by this control parameter. By varying the saturation state in the core, the switch unit can be switched between a conductive and a non-conductive state. It is thereby possible to achieve a similar switching function to that which was previously performed by semiconductors. In the following, the magnetically acting switch device is therefore also referred to as an "inductive" or "magnetic" switch.

The omission of power-electronic structural components is a great advantage in the context of DC compensation. With this, the reliability of the DC compensation system is increased and its service life is comparatively longer. The configuration is very simple, can be realized at very low cost, and is non-wearing.

The limit of use of the unidirectional flux compensation can be extended upwards: the voltage applied to the compensation winding, which at approximately 700 V currently represents an obstacle in practice to the use of unidirectional flux compensation featuring semiconductors, is no longer the limit. The invention allows the use of unidirectional flux compensation at even higher voltages and therefore in transformers of higher power, such as HVDCT transformers.

Comparatively higher compensation currents can be generated and injected into the compensation winding. Until now, these feed currents were limited by the power capability of the semiconductors, i.e., by the maximum permitted power dissipation at the thyristor. By virtue of the inventive arrangement, use is extended to include GIC compensation.

In an embodiment which is particularly preferred in terms of simplicity, the winding arrangement is formed by a control winding that is connected to the control unit, and a load winding that is integrated into the current path. This results in a transductor that controls the inductance of the load winding via the magnetic modulation of the core material. This circuit arrangement is simple and can be produced at very low cost.

An embodiment can be beneficial in which the control winding is formed of a plurality of auxiliary windings which are connected in series and whose arrangement is selected such that the induced voltage at the connection terminals is zero.

An embodiment can be particularly advantageous in which the load winding is configured so as to serve simultaneously as a device for limiting current in the current path, i.e., to act as a reactor in the conductive state of the transductor. The self-inductance of this reactor is dimensioned so as to provide a current limitation in the current path. A separate reactor is then no longer required for the purpose of current limitation.

It is also advantageous that the switch device consisting of winding arrangement and magnet core can easily be accommodated within the transformer tank. The insulating and cooling liquid contained in the tank can therefore be used simultaneously for very efficient cooling of the winding of the switch device. This reliable and easy cooling allows the field of use to be extended to include very high compensation currents.

It is also an object of the invention to provide a method for converting a transformer, where the core of a transformer includes a compensation winding, or is equipped with such a compensation winding during the course of the upgrade. The latter can be effected during the course of a maintenance stoppage, in which the insulating and cooling liquid is partially bled and the compensation winding is mounted on the core. Instead of using a semiconductor circuit for the purpose of generating the compensation current ($I_K$), use is inventively made of the above-described "magnetically acting" switch device. As a result, it is possible to easily and significantly reduce or completely eliminate the unidirectional flux component retrospectively, even in the case of a transformer that is already in operation.

When upgrading or converting likewise, it can be advantageous again to arrange the magnetically acting switch device in the transformer tank, in order that the existing insulating and cooling liquid simultaneously cools the winding arrangement of the "magnetically acting" switch device in addition to the primary and secondary windings. The inventive switch device only requires a modest structural volume. Consequently, the arrangement within the tank does not present a problem.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In a further explanation of the invention, reference is made in the following part of the description to drawings, from which further advantageous embodiments, details and developments of the invention can be derived on the basis of a non-restrictive exemplary embodiment, and in which:

FIG. 1 shows a schematic block diagram which generally illustrates the operating principle of a unidirectional flux compensation comprising a clocked switch unit for generating a compensation current;

FIG. 2 shows a waveform of the compensation current in the block schematic diagram from FIG. 1;

FIG. 3 shows an arrangement comprising a magnetic switch which comprises a transductor in accordance with the invention;

DETAILED DESCRIPTION OF THE EXEMPLARY EMBODIMENTS

Figure 4:
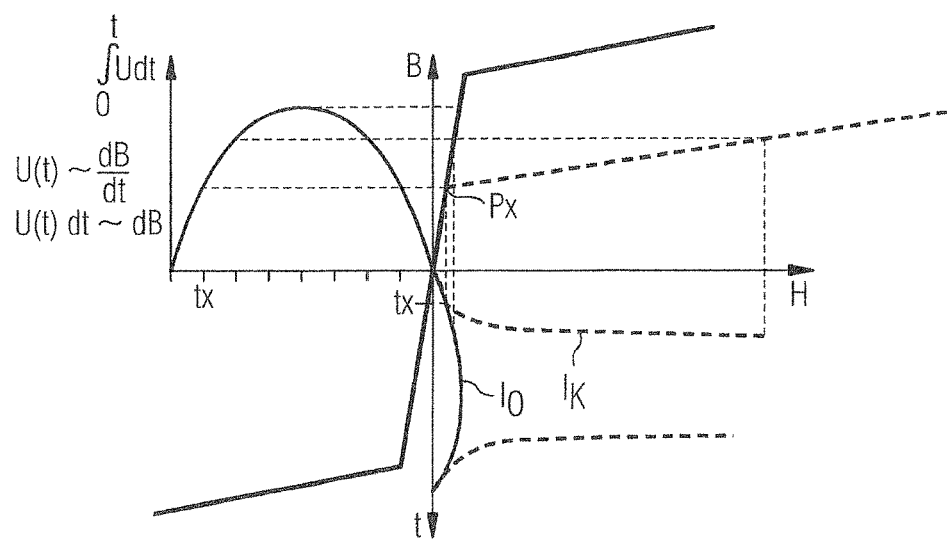
FIG. 4 shows a graphical plot of a B/H curve which illustrates the operating principle of the magnetic switch in accordance with the invention.

Before explaining the embodiment of the invention, a brief illustration of the operating principle of the unidirectional flux compensation via a clocked switch element is given with reference to FIG. 1 and FIG. 2. In FIG. 1, the compensation winding K is portrayed as voltage source $U_K$, i.e., the load alternating flux passing through the compensation winding K induces therein a voltage $U_K$ that is present at the terminals K1, K2 of the compensation winding K. This voltage $U_K$ is used as an energy source for generating a compensation current $I_K$. There is no separate energy source. The generation of the compensation current is effected by a clocked switch unit 5. This switch unit 5 is situated in series with the compensation winding K in a current path 6. A reactor 2 is also situated in the current path 6. The reactor 2 is used to limit the current i in the current path 6, specifically by limiting the current rise at the instant of closing by virtue of its inductance L. In order to compensate a magnetic unidirectional flux component $\Phi_{DC}$ in the core 1 of the transformer, the switch 5 is clocked by a control unit 9 in a manner which is network-synchronous but can vary in activation time, such that an electrical current with harmonic vibrations is produced in the current path 6, where the electrical current contains a direct component that counteracts the unwanted unidirectional flux $\Phi_{DC}$ in the core of the transformer. As mentioned previously, it is not necessary when using this operating principle to provide an external energy source in the form of a battery or capacitor, because the energy comes from the induced voltage $U_K$ itself. The switch unit 5 can be formed of semiconductors, as disclosed, e.g., in the document WO 2012/041368 A1 cited in the introduction. Thyristors in phase-angle control are suitable for this purpose, being fired at a specific phase angle and blocking again automatically at current zero. The level of the direct current can be adjusted via the phase angle, i.e., via the activation time.

FIG. 2 shows the time characteristic of the pulsating direct current. The voltage $U(t)=U_K \sin(\omega^*t)$ is present at the terminals K1, K2. The switch is open and therefore i=0 until the firing time point $t_x$. After the firing time point $t_x$, the switch 5 is closed and remains closed until the next current zero $(T-t_x)$. The time characteristic of the current in the interval $[t_x, T-t_x]$ is $i(t)=U_K/\omega^*L \ (\cos(\omega^*t_x)-\cos(\omega^*t))$.

The operation of the "magnetic switch" is explained in greater detail below.

FIG. 3 shows an exemplary embodiment of the inventive arrangement for the compensation of a magnetic unidirectional flux component $\Phi_{DC}$ in the core 1 of a transformer, which is not shown in detail. A section of the magnetically soft core 1, coupled to a compensation winding K, can be seen in FIG. 3. In addition to the alternating flux, a disruptive magnetic unidirectional flux $\Phi_{DC}$ also flows proportionately in the core 1.

In order to compensate this unidirectional flux component $\Phi_{DC}$, it must first be identified in respect of level and direction. One possibility for measuring the unidirectional flux component $\Phi_{DC}$ is proposed in PCT/EP2010/054857, for example, which operates in the manner of a "magnetic bypass": part of the main magnetic flux in the transformer core is diverted via a ferromagnetic shunt part and fed back in again downstream. The magnetic field strength in the core section that is bypassed by the shunt arm can be determined either directly or indirectly from this diverted flux part that is routed in the shunt of the core. This capturing of the magnetic field strength or magnetic excitation functions reliably and is highly suitable for long-term use. However, other methods are suitable.

In order to reduce the effect of a unidirectional flux component $\Phi_{DC}$, a switch device is inventively connected at the terminals K1 and K2 in FIG. 3, where a compensation current $I_K$ can be generated and injected into the compensation winding K via the switch device without an external energy source. In contrast with the prior art, this device has no power-electronic structural components. It consists essentially of a current controlling power transductor 4. This transductor 4 acts as a clocked switch, i.e., its control winding 3 receives a control current 11 which can be varied in level and is triggered by the network, thereby achieving a switching function in the current path 6. Three inductances 20, 2 and K are arranged in an electrical series connection in the current path 6, the arrangement being depicted schematically rather than symbolically in FIG. 3.

In practical embodiments, the component groups below the dash-dot line in the illustration of FIG. 3 are situated not in the internal space 14 of the transformer tank, but outside.

The current limiting reactor 2 and the load winding 20 of the transductor 4 can also be combined to form an inductance L.

The generation and injection of the compensation current $I_K$ into the compensation winding K is explained in greater detail below.

As stated above, the generation of the compensation current $I_K$ is effected by the magnetically acting switch device 5 in the manner of a transductor. This consists essentially of a winding arrangement 3, 20 formed of a control winding 3 and a load winding 20 which are coupled to a magnetic core 10. The core 10 is closed and has no air gap. The magnetic material in the core 10 is premagnetized via the control current 11 flowing in the control winding 3, i.e., modulated between the state of saturation and non-saturation.

FIG. 4 illustrates the operating principle of the switch device with reference to the B/H curve of the core 10. The continuous lines show the unfired state, while the broken lines show the through-connected state.

If the core 10 is not saturated, i.e., the inductance is high, the impedance is high and only a very small excitation current $I_0$ flows in the current path 6. The switch 5 can be considered as blocking or open.

If starting at the time point $t_x$ the core 10 is partly then fully (see point $P_x$ in FIG. 4) saturated via the control winding 3, then the inductance decreases significantly and an increasing current $I_K$ begins to flow in the current path 6. The flux that is linked to this current $I_K$ causes the magnetic material of the core 10 to remain saturated, such that the initial firing by the current 11 in the control winding 3 is no longer required and can be switched off. (This fundamental characteristic is similar to a thyristor: once it has been fired, the thyristor can no longer be controlled, in particular switched off, via the control interface.) In this state, the switch device 5 is therefore in a conductive state, i.e., the switch 5 is closed. This through-connected state continues until the alternating current zero is reached. The current flow is then interrupted and the switch 5 must be fired again for a subsequent switching action. The reactor 2 is used for current limitation in the through-connected state.

Depending on the level and direction of the compensation current $I_K$ that is required for GIC or DC compensation, the activation time $t_x$ is controlled such that the resulting arithmetic mean value of the pulsating current in the compensation winding K brings about the desired $\Phi_{DC}$ compensation effect. The activation time $t_x$ determines the extent of the GIC or DC compensation effect. This "firing" or activation process is triggered in a phase-synchronous manner, i.e., synchronous to the voltage in the compensation winding K. The current injection into the control winding 3 is therefore similar to the conductive switching of a semiconductor, such as the firing of a thyristor. As in the case of a thyristor, the "firing" is followed by a current flow which automatically expires again. The magnetic switch 5 initially remains saturated until the current zero or near to the current zero, when the saturation of the ferromagnetic circuit is terminated again. The magnetic switch then has a high inductance again and can be considered as blocking, i.e., as an open switch in terms of its switching state.

As illustrated above, the injection of the control current 11 is synchronous to the network, while the level and direction of the control current 11 are specified according to the magnetic unidirectional flux component $\Phi_{DC}$ that is to be compensated. Therefore, two signals are supplied to the control device 9 on the input side. Firstly, the induced voltage $U_K$ that is present at the terminals K1, K2 of the compensation winding K and from which the activation time can be specified in a network-synchronous manner, i.e., phase-synchronous to the voltage $U_K$ in the compensation winding. Secondly, a measurement signal 8 that comes from a measurement apparatus 7 that detects the magnetic unidirectional flux component $\Phi_{DC}$. The capture and processing of these two signals 8, 14 is known and can be transferred from the previously cited document PCT/EP2010/054857, for example.

The magnetically acting switch 5 can be formed in various ways.

Figure 5:
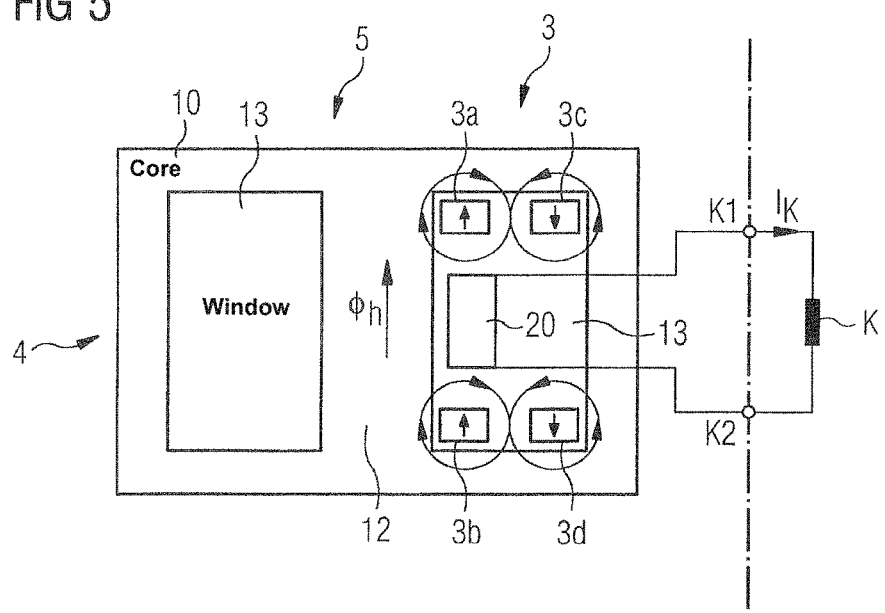
FIG. 5 shows a first exemplary embodiment of the magnetic switch in accordance with the invention.

FIG. 5 shows a first possible embodiment of the switch 5 in accordance with the invention. Illustrated is an exemplary core 10 of the switch unit 5 in the form of a single-phase sleeve core. For purposes of simplicity, FIG. 5 only shows the right hand symmetrical half. The central limb 12 supports the load winding 20 of the transductor 4. The control winding 3 and load winding 20 are magnetically coupled together via the core 10. The control winding 3 consists of a plurality of individual windings or auxiliary windings 3a, 3b, 3c, 3d. These auxiliary windings 3a, 3b, 3c, 3d are arranged above and below in the window 13 of the 1-limb core. They are interconnected at the ends of their windings such that the magnetic material of the core 10 can be switched between saturated and non-saturated according to the direction of the direct current in the auxiliary winding arrangement 3a, 3b, 3c, 3d.

Figure 6:
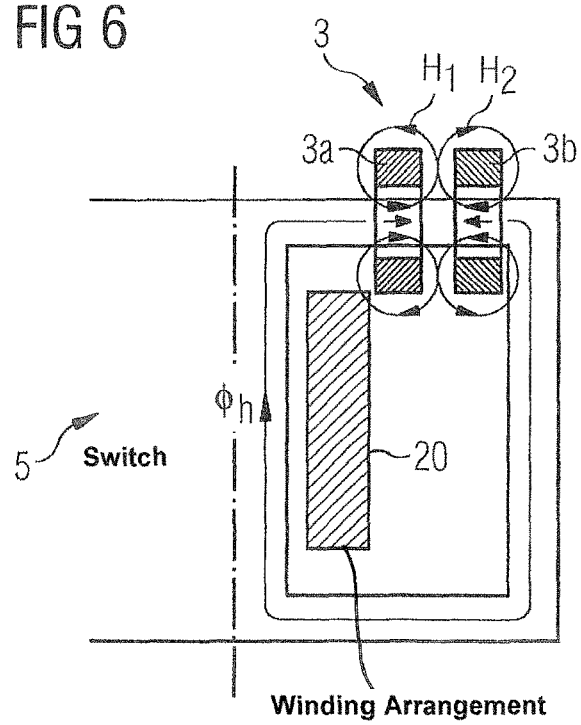
FIG. 6 shows a second exemplary embodiment of the magnetic switch in accordance with the invention.

FIG. 6 shows a second embodiment of a transductor, in which two auxiliary windings 3a, 3b are arranged at the top in the window and are connected in series with opposite winding directions but the same number of turns. The flux $\Phi_h$ in the transductor 5 induces a voltage that then amounts to zero. This aids the injection of the control current 11.

Figure 7:
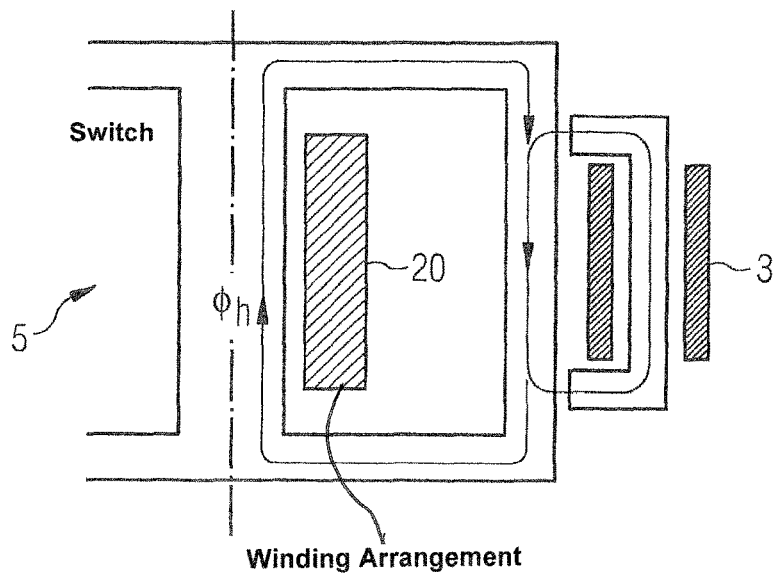
FIG. 7 shows a third exemplary embodiment of the magnetic switch in accordance with the invention.

FIG. 7 shows a third embodiment of a transductor, in which the saturation in the core 10 of the transductor 4 is varied via a control winding or auxiliary winding 3 and via an air gap L, according to the desired switching behavior. By virtue of the coupling via the air gap, the auxiliary winding current injection can be switched off using a minimal induced voltage.

As stated above, the semiconductorless switch device 5 in accordance with the invention has the significant advantage that greater reliability and operational security can be achieved. The disclosed embodiments of the invention allow Direct Current Compensation (DCC) technology to be used in transformers in a very high power class. A comparatively high voltage at the compensation winding can be managed with modest technical expenditure. The use is no longer limited to voltages within the low-voltage specifications, i.e., up to 690 V. The power transductor can be utilized for the compensation of GIC, where comparatively high compensation currents are required. This was not previously possible, since the use of thyristors is not only technically limited due to power dissipation, but is also hard to justify financially. Moreover, it is difficult to guarantee the required reliability over an extended operating period using a semiconductor switch device. A large heat sink and possibly fan cooling, normally essential for semiconductor switch elements, is not required due to the arrangement in the internal space of the tank.

It is also advantageous that the switch in accordance with disclosed embodiments of the invention can be installed in the transformer tank, which has the advantage of liquid cooling. Efficient and reliable cooling allows the use of unidirectional flux compensation in transformers of very high power, such as HVDCT transformers.

For the purpose of generating the compensation current, the voltage that is induced in the compensation winding serves as an energy source. A separate energy store, such as a battery or a capacitor, is not required.

It is also advantageous that the switch device in accordance with disclosed embodiments of the invention is formed largely of materials that would also be otherwise used in the construction of transformers (insulated winding wires, magnetically soft core materials). The handling of these materials is familiar to the manufacturer of a transformer. The costs of manufacture are significantly lower in comparison with a solution featuring semiconductors. In comparison with a semiconductor switch, which must be estimated to have a service life of less than 15 years, the "inductive switch" in accordance with disclosed embodiments of the invention has a comparatively longer service life. Electrical transformers that are used in energy supply and distribution networks are long-term capital goods for which a long service life and high reliability are demanded. Always seeking reliability and long service life, the clients, i.e., network operators, will welcome the omission of power-electronic structural components.

It can be said in summary that power electronics are made obsolete by the invention and can be completely replaced by a passive solution. In order to compensate a unidirectional flux component, there is no longer a need for semiconductor components, and only the control electronics for modulating the switch device and the measurement apparatus for capturing the unidirectional flux component are required.

Figure 8:
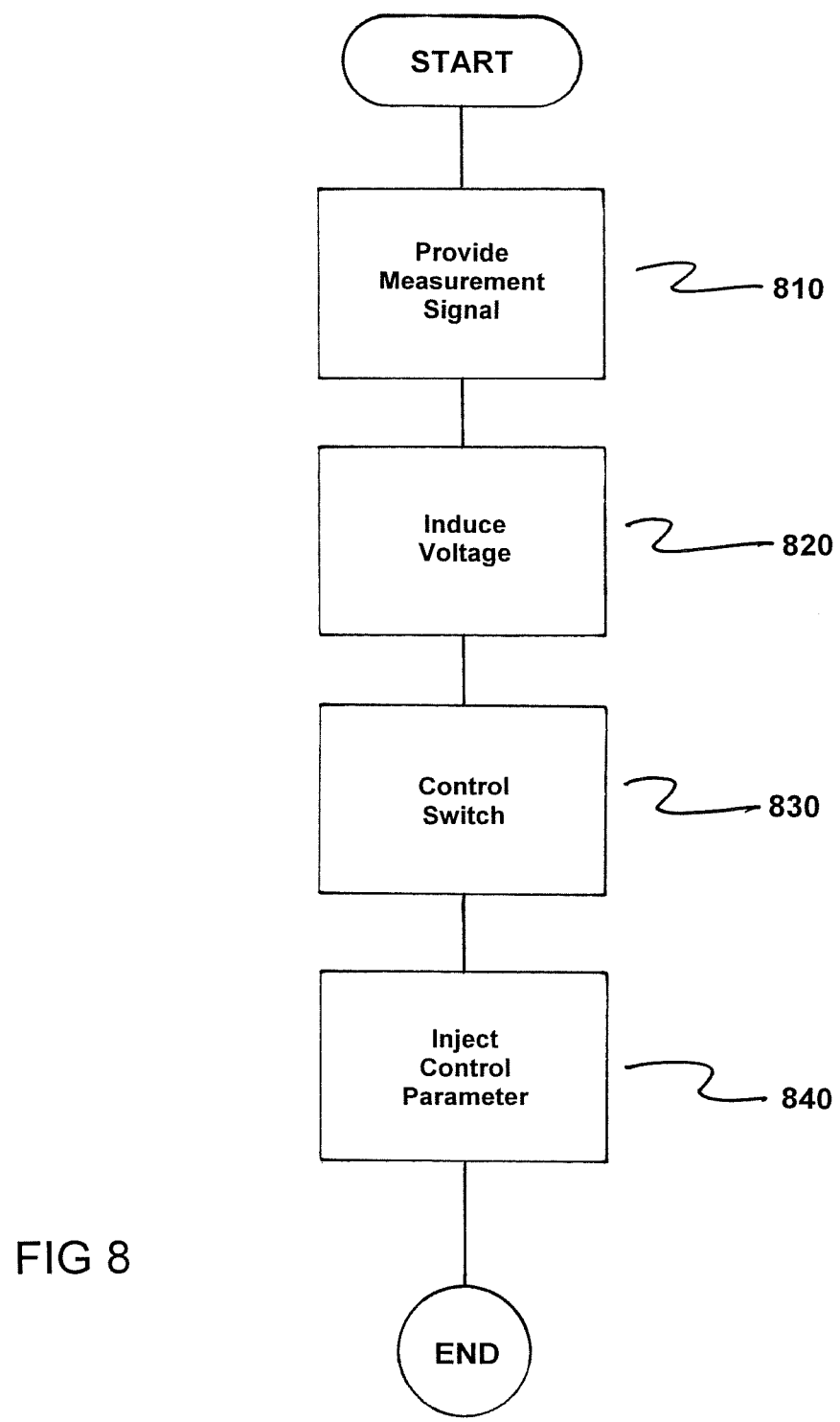
FIG. 8 is a flowchart of the method in accordance with the invention.

FIG. 8 is a flowchart of a method for reducing a magnetic unidirectional flux component in the core 1 of a transformer. The method comprises providing, by a measurement apparatus 7, a measurement signal 8 corresponding to the magnetic unidirectional flux component $\Phi_{DC}$, as indicated in step 810. Next, a voltage $U_K$ is induced by a compensation winding K magnetically coupled to the core 1 of the transformer and in which the magnetic flux flowing in the core 1, as indicated in step 820. In accordance with the invention, a switch device 5 is arranged electrically in series with the compensation winding K in a current path 6, where the switch device 5 comprises a magnetic core 10 and a winding arrangement 3, 20 which is magnetically coupled to the magnetic core 10. Next, the switch device 5 is controlled by a control device 3 via a control parameter 11, whereby the switch device 5 is switchable to a conductive state at an activation time, as indicated in step 830. Here, the activation time is specified according to the measurement signal 8 and is network-synchronous.

Next, the control parameter 11 is injected into the winding arrangement 3, 20 as a control current, such that a conductive state of the switch device 5 is achieved by varying the magnetic saturation state of the magnetic core 10, as indicated in step 840.

Figure 9:
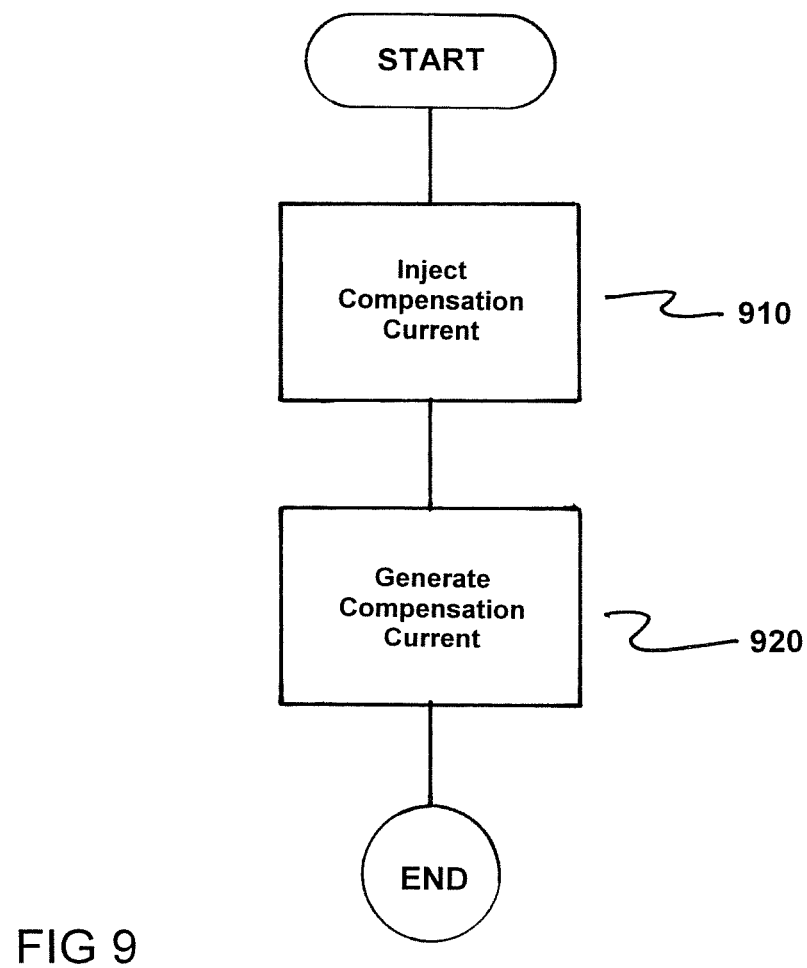
FIG. 9 is a flowchart of the method for converting a transformer in accordance with the invention.

FIG. 9 is a flowchart of a method for converting a transformer. The method comprises injecting a compensation current $I_K$ via a core 1 of the transformer having or being equipped with a compensation winding K which is suitable for compensating a unidirectional flux component $\Phi_{DC}$ present in the core 1, as indicated in step 910. Next, the compensation current $I_K$ is generated by a switch device 5 connected to the compensation winding K, as indicated in step 920. In accordance with the invention, the switch device 5 is foiled by a magnetic core 10 and a winding arrangement 3, 20 which is magnetically coupled to this core 10, where the switch device 5 is controllable by a control unit 9.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An arrangement for reducing a magnetic unidirectional flux component in a core of a transformer, comprising:
    a measurement apparatus which provides a measurement signal corresponding to the magnetic unidirectional flux component;
    a compensation winding magnetically coupled to the core of the transformer, the magnetic unidirectional flux flowing in the core inducing a voltage in the compensation winding;
    a switch device arranged electrically in series with the compensation winding in a current path;
    a control device which controls the switch device via a control parameter such that the switch device is switchable to a conductive state at an activation time which is dependent on the measurement signal and is network-synchronous, whereby a compensation current is injected into the compensation winding, an effect of which is directed against the unidirectional flux component;
    wherein the switch device comprises a magnetic core and a winding arrangement which is magnetically coupled to the magnetic core;
    wherein the control parameter is supplied to the winding arrangement such that a magnetic saturation state of the magnetic core is variable, whereby the conductive state of the switch unit is produceable.

2. The arrangement as claimed in claim 1, wherein the winding arrangement comprises:
    a control winding which is connected to the control device to introduce a control current; and
    a load winding which is integrated into the current path.

3. The arrangement as claimed in claim 2, wherein the control winding comprises a plurality of auxiliary windings which are connected in series and having an arrangement which is selected such that an induced voltage at connection terminals is zero.

4. The arrangement as claimed in claim 2, wherein the load winding is further configured as a device for limiting a current in the current path.

5. The arrangement as claimed in claim 1, wherein the switch device is arranged in an internal space of a transformer tank which is filled with an insulating and cooling liquid.

6. The arrangement as claimed in claim 1, wherein the activation time which is dependent on the measurement signal and is network-synchronous is phase-synchronous to the voltage in the compensation winding.

7. A method for reducing a magnetic unidirectional flux component in a core of a transformer, the method comprising:
    providing, by a measurement apparatus, a measurement signal corresponding to the magnetic unidirectional flux component;
    inducing a voltage by a compensation winding magnetically coupled to the core of the transformer and in which the magnetic flux flowing in the core of the transformer, a switch device being arranged electrically in series with the compensation winding in a current path, said switch device comprising a magnetic core and a winding arrangement which is magnetically coupled to the magnetic core;
    controlling, by a control device, the switch device via a control parameter, whereby the switch device is switchable to a conductive state at an activation time, the activation time being specified according to the measurement signal and being network-synchronous; and
    injecting the control parameter into the winding arrangement as a control current, such that a conductive state of the switch device is achieved by varying a magnetic saturation state of the magnetic core.

8. The method as claimed in claim 7, wherein the switch device comprises:
    a control winding which is connected to the control device; and
    a load winding, which is integrated into the current path.

9. The method as claimed in claim 7, wherein the control winding comprises a plurality of auxiliary windings which are connected in series and having an arrangement which is selected such that an induced voltage at the connection terminals is zero.

10. The method as claimed in claim 8, wherein the load winding is configured as a device for limiting the current in the current path.

11. The method as claimed in claim 7, wherein the activation time which is dependent on the measurement signal and is network-synchronous is phase-synchronous to the voltage in the compensation winding.

12. A method for converting a transformer, the method comprising:
   injecting a compensation current via a core of the transformer having or being equipped with a compensation winding which is suitable for compensating a unidirectional flux component present in the core; and
   generating the compensation current by a switch device connected to the compensation winding, said switch device being formed by a magnetic core and a winding arrangement which is magnetically coupled to this core, the switch device being controllable by a control unit.

13. The method as claimed in claim 12, wherein the switch device is arranged in an internal space of a transformer tank.

14. A transductor for reducing a magnetic unidirectional flux component in a core of a transformer,
   wherein the transductor includes:
      a magnetic core, and
      a load winding and a control winding, which are arranged on the magnetic core and are magnetically coupled together via the magnetic core,
   wherein the load winding is connected in a current path in series with a compensation winding which is arranged on the core of the transformer; and
   wherein the control winding is connected to a switch device which is configured to inject a control current into the control winding in a network-synchronous manner and in accordance with the unidirectional flux component that is to be compensated.

* * * * *